United States Patent
Cheah et al.

(10) Patent No.: US 11,289,427 B2
(45) Date of Patent: Mar. 29, 2022

(54) MULTI-FACETED INTEGRATED-CIRCUIT DICE AND PACKAGES

(71) Applicant: Intel Corporation, Santa Clara, CA (US)

(72) Inventors: Bok Eng Cheah, Bukit Gambir (MY); Jackson Chung Peng Kong, Tanjung Tokong (MY); Jenny Shio Yin Ong, Bayan Lepas (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 16/818,558

(22) Filed: Mar. 13, 2020

(65) Prior Publication Data

US 2020/0395309 A1 Dec. 17, 2020

(30) Foreign Application Priority Data

Jun. 11, 2019 (MY) .............................. PI2019003289

(51) Int. Cl.
*H01L 21/00* (2006.01)
*H01L 23/538* (2006.01)
*H01L 23/48* (2006.01)

(52) U.S. Cl.
CPC ........ *H01L 23/5389* (2013.01); *H01L 23/481* (2013.01); *H01L 23/5387* (2013.01)

(58) Field of Classification Search
CPC .............. H01L 23/5389; H01L 23/481; H01L 23/5387
See application file for complete search history.

(56) References Cited

U.S. PATENT DOCUMENTS

| | | | |
|---|---|---|---|
| 10,325,774 B2* | 6/2019 | Dasgupta | H01L 21/02647 |
| 10,930,500 B2* | 2/2021 | Dasgupta | H01L 21/02521 |
| 2002/0081838 A1* | 6/2002 | Bohr | H01L 23/147 438/637 |
| 2017/0236704 A1* | 8/2017 | Dasgupta | H01L 21/02639 257/76 |
| 2019/0287789 A1* | 9/2019 | Dasgupta | H01L 29/16 |
| 2020/0168724 A1* | 5/2020 | Huang | H01L 29/66356 |
| 2020/0309910 A1* | 10/2020 | McCord | G01S 7/4815 |
| 2020/0395309 A1* | 12/2020 | Cheah | H01L 23/5387 |
| 2021/0296225 A1* | 9/2021 | Nad | H01L 23/50 |
| 2021/0343635 A1* | 11/2021 | Swan | G03F 1/54 |

\* cited by examiner

*Primary Examiner* — Laura M Menz
(74) *Attorney, Agent, or Firm* — Schwegman Lundberg & Woessner, P.A.

(57) ABSTRACT

A faceted integrated-circuit die includes a concave facet with an increased interconnect breakout area available to an adjacent device such as a rectangular IC die that is nested within the form factor of the concave facet. The concave facet form factor includes a ledge facet and a main-die facet. Multiple nested faceted IC dice are disclosed for increasing interconnect breakout areas and package miniaturization. A faceted silicon interposer has a concave facet that also provides an increased interconnect breakout area and package miniaturization.

7 Claims, 9 Drawing Sheets

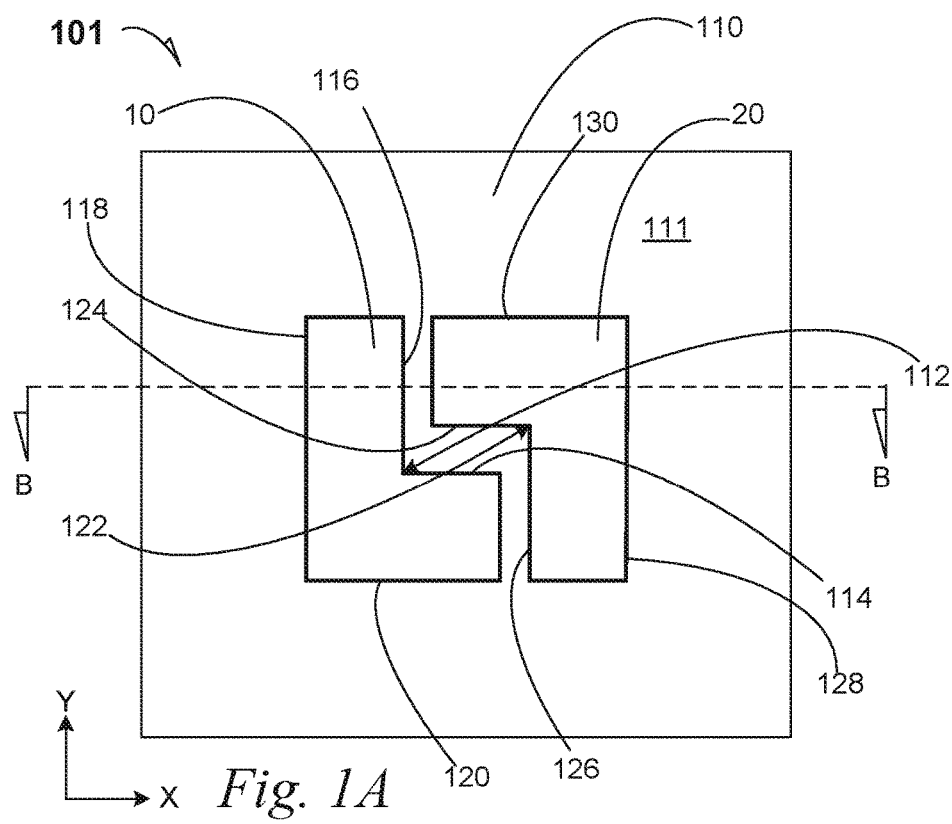
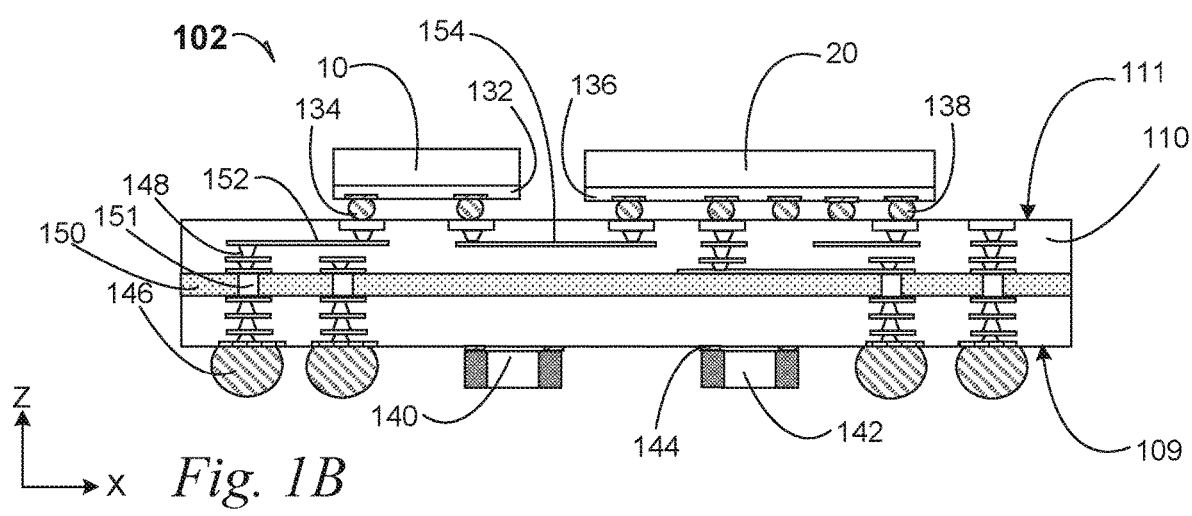

MULTI-FACETED INTEGRATED-CIRCUIT DICE AND PACKAGES

PRIORITY APPLICATION

This application claims the benefit of priority to Malaysian Application Serial Number PI2019003289, filed Jun. 11, 2019, which is incorporated herein by reference in its entirety.

FIELD

This disclosure relates to semiconductor packages that use multi-faceted integrated-circuit dice in close-proximity arrangements for smaller form-factor packaging.

BACKGROUND

Semiconductive device miniaturization during packaging includes challenges to locate interacting devices in useful proximity to other structures and to manage package physical integrity.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a top plan of an integrated-circuit apparatus that includes at least one faceted integrated circuit die on a package substrate according to an embodiment;

FIG. 1B is a cross-section and partial cut-away elevation of the integrated-circuit apparatus depicted in FIG. 1A according to an embodiment;

DETAILED DESCRIPTION

Figure 2A:
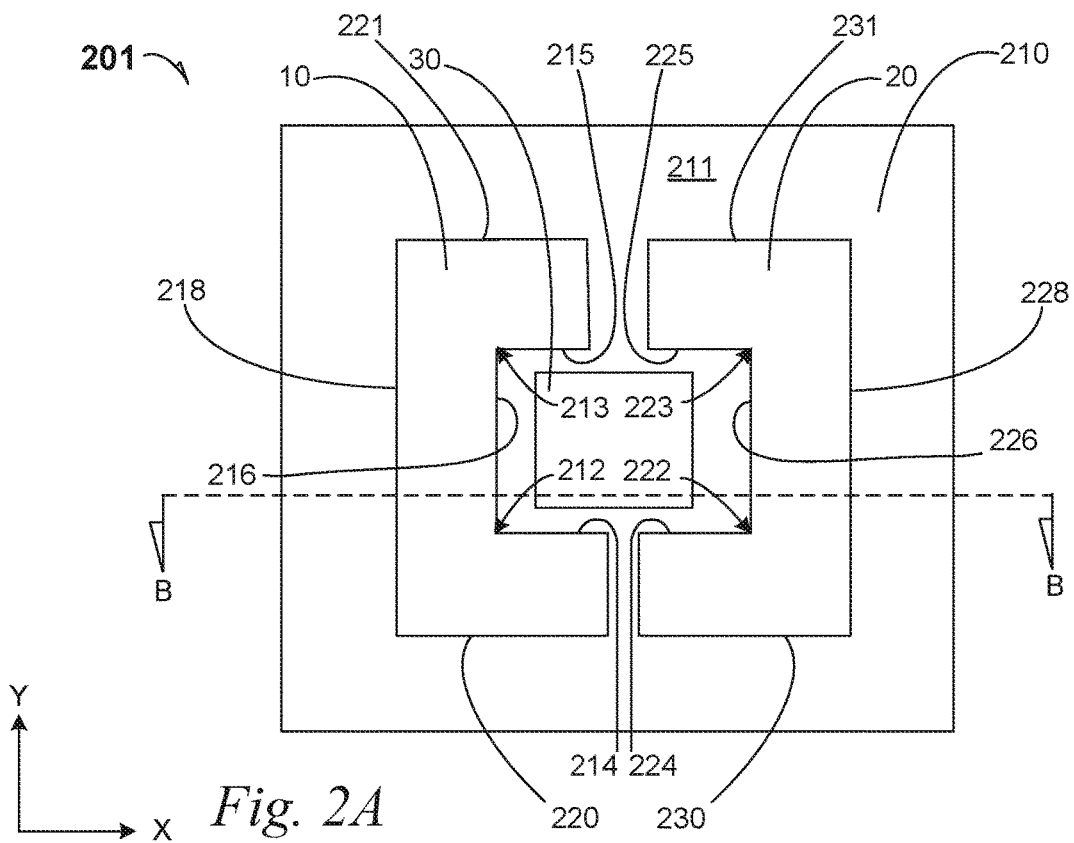
FIG. 2A is a top plan of an integrated-circuit apparatus that includes at least one faceted integrated circuit die on a package substrate according to an embodiment.

A faceted integrated-circuit die is assembled on a package substrate next to another device. Breakout regions at concave facets of a given integrated circuit die, allow for dense interconnection between a faceted integrated circuit die and an adjacent device. The faceted integrated-circuit die provides an increased periphery by which pathways are shortened between electrical humps on a die and a package ball-grid-array. The shortened pathways improve and lower insertion loss and signal crosstalk degradation, while providing a smaller integrated-circuit package.

FIG. 1A is a top plan of an integrated-circuit apparatus 101 that includes at least one faceted integrated circuit die 10 on a package substrate 110 according to an embodiment. A first faceted integrated-circuit (IC) die 10 is on the semiconductor package substrate 110, on a die side 111. The first faceted IC die 10 has faceting that is characterized by at least one concave facet 112 that is formed by the intersection of a ledge facet 114 and a main-chip facet 116. As illustrated, the main chip portion of the faceted IC die 10 runs principally along the Y-direction, and the ledge portion runs principally in the X-direction, beyond the main chip portion. The main-chip facet 116 is opposite a main-chip long edge 118, and the main-chip portion is defined as the integrated-circuit material between the main-chip long edge 118 and the extended main-chip facet 116. Similarly, the ledge portion is defined as the integrated-circuit material between the ledge facet 114 and a ledge-portion long edge 120 that is opposite the ledge facet 114 and limited to the length of the ledge facet 114.

In an embodiment, the first faceted IC die 10 is nested with a second faceted IC die 20. Although the second faceted. IC die 20 has a concave facet 122, the first faceted IC die 10 can be nested to a square or rectangular IC die with one corner being nested near the first IC die concave facet 112. For example, a third die 30 (see, e.g. FIG. 2A) can be nested as a rectangular die with respect to a concave facet 212, and in FIG. 1A, a rectangular die could similarly be nested with respect to the concave facet 112, and in place of the second faceted IC die 20.

In an embodiment, the second faceted IC die 20 has faceting that is characterized by at least one concave facet 122 that is formed by the intersection of a ledge facet 124 and a main-chip facet 126. The main-chip facet 126 is opposite a main-chip long edge 128, and the ledge facet 124 is opposite a ledge portion long edge 130.

For a neighboring device to be "nested" to a faceted IC die, one corner of the neighboring device both overlaps the main-chip facet of a faceted IC die, and one corner of the neighboring device overlaps into the region of the ledge facet. For example, the second faceted IC die 20 is nested near the concave facet 112 of the first faceted IC die 10 by a corner that is near the concave facet 112, that overlaps the main-chip facet 116 in the Y-direction, and that overlaps the ledge facet 114 in the X-direction.

FIG. 1B is a cross-section and partial cut-away elevation 102 of the integrated-circuit apparatus 101 depicted in FIG. 1A according to an embodiment. FIG. 1B is taken from the section line B-B in FIG. 1A. In cross section, the integrated-circuit apparatus 102 depicts the first faceted IC die 10 and the second faceted IC die 20 upon the die side 111 of the package substrate 110. The first faceted IC die 10 is seated, flip-chip style, with active devices and metallization 132 bonded through electrical bumps 134 to the die side 111. Similarly in an embodiment, the second faceted IC die 20 is seated with active devices and metallization 136 bonded through electrical bumps 138 to the die side 111.

In an embodiment, passive devices such as capacitors 140 and 142 are located on a land side 109 of the package substrate 110, where the capacitors 140 and 142 are upset capacitors within or close to within the X-Y die shadow of at least one of the first faceted IC die 10 and the second faceted IC die 20.

By way of illustration, the capacitor 142 is illustrated with end electrodes or terminals (darker) and the capacitor body (lighter), and the capacitor 142 is electrically coupled to the package substrate 110 by direct contact to a solder layer 144.

In cross-section and partial cut-away view of FIG. 1B, the package substrate 110 illustrates electrical routing between electrical bumps 146, such as ball-grid array electrical bumps 146 on the land side 109, and the first faceted IC die 10 and the second faceted IC die 20.

Electrical routing includes a vertical composite via 148 that may communicate between the die side 111 and the land side 109. The vertical composite via 148 includes a core via portion 151 that passes through a core section 150 of the package substrate 110 according to an embodiment. Electrical routing also includes via-to-via traces 152 that couple the land-side bump 146 to a die-side faceted IC die 10. Electrical routing also includes inter-die traces 154 for coupling at least one faceted IC die 10 to a second device 20. For example, the inter-die trace 154 couples the first faceted IC die 10 to the second faceted IC die 20 within the package substrate 110.

FIG. 2A is a top plan of an integrated-circuit apparatus 201 that includes at least one faceted integrated circuit die 10 on a package substrate 210 according to an embodiment. A first faceted integrated-circuit (IC) die 10 is on the semiconductor package substrate 210, on a die side 211. The first faceted IC die 10 has double faceting that is characterized by at least two concave facets 212 and 213 that are formed by the intersection of respective ledge facets 214 and 215 and a main-chip facet 216. As illustrated, the main chip runs principally along the Y-direction with extensions of the main-chip facet 216 running parallel with a main-chip long edge 218. The ledges run principally in the X-direction, beyond the main chip. The ledge portions can be defined in X-Y area, as the ledge facets 214 and 215 and equivalent lengths of the respectively opposite ledge-portion long edges 220 and 221.

In an embodiment, the length of the ledge facet 214 is longer than the length of the ledge facet 215. For example, processing within the IC portion of the ledge facet 214 and the equivalent length of the ledge-portion long edge 220, is different in kind compared to processing within the IC portion of the ledge facet 215 and the equivalent length of the ledge-portion long edge 221.

In an embodiment, the first faceted IC die 10 is nested with a second faceted IC die 20. Although the second faceted. IC die 20 has concave facets 222 and 223, the first faceted IC die 10 is nested to a square or rectangular IC third die 30 with corners being nested near the first. IC die concave facets 212 and 213. Similarly, the third IC die 30 is nested to the second faceted IC die 20 with corners being nested near the second IC die concave facets 222 and 223.

In an embodiment, the second faceted IC die 20 faceting is characterized by concave facets 222 and 223 that formed by the intersection of respective ledge facet 224 and 225 and a main-chip facet 226. The main-chip facet 226 is opposite a main-chip long edge 228, and the ledge facets 224 and 225 are opposite respective ledge-portion long edges 230 and 231.

Figure 2B:
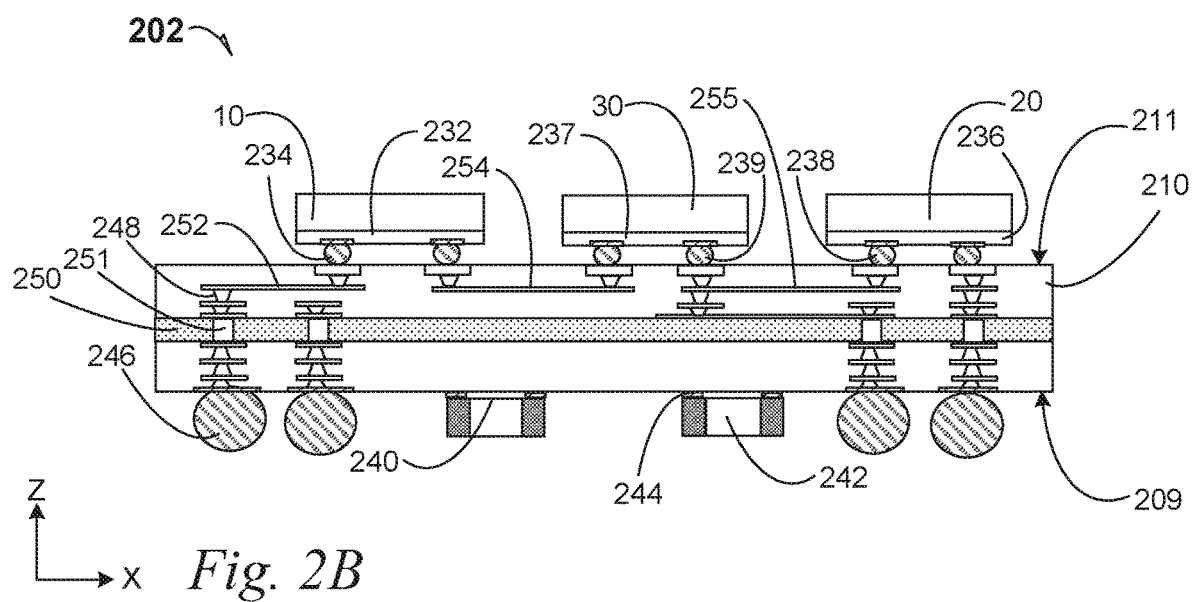
FIG. 2B is a cross-section and partial cut-away elevation of the integrated-circuit apparatus depicted in FIG. 2A according to an embodiment.

FIG. 2B is a cross-section and partial cut-away elevation 202 of the integrated-circuit apparatus 201 depicted in FIG. 2A according to an embodiment. FIG. 2B is taken from the section line B-B in FIG. 2A. In cross section, the integrated-circuit apparatus 202 depicts the first faceted IC die 10, the second faceted IC die 20 and the third IC die 30 upon the die side 211 of the package substrate 210.

The first faceted IC die 10 is seated, flip-chip style, with active devices and metallization 232 bonded through electrical bumps 234 to the die side 211. Similarly in an embodiment, the second faceted IC die 20 is seated with active devices and metallization 236 bonded through electrical bumps 238 to the die side 211. Similarly, the third IC die 30 is seated with active devices and metallization 237 bonded through electrical bumps 239 that also contact the die side 211.

In an embodiment, passive devices such as capacitors 240 and 242 are located on a land side 209 of the package substrate 210, where the capacitors 240 and 242 are upset capacitors within or close to within the X-Y die shadow of at least one of the first faceted IC die 10, the second faceted IC die 20 and the third IC die 30.

By way of illustration, the capacitor 242 is illustrated with end electrodes or terminals (darker) and the capacitor body (lighter), and the capacitor 242 is electrically coupled to the land side 209 by direct contact to a solder layer 244.

In cross-section and partial cut-away view of FIG. 2B, the package substrate 210 illustrates electrical routing between electrical bumps 246, such as ball-grid array electrical bumps 246 on the land side 209, and the first faceted IC die 10, the second faceted IC die 20, and the third IC die 30.

Electrical routing includes a vertical composite via 248 that may communicate between the die side 211 and the land side 209. The vertical composite via 248 includes a core via portion 251 that passes through a core section 250 of the package substrate 210 according to an embodiment. Electrical routing also includes via-to-via traces 252 that couple a land-side bump 246 to a die-side faceted IC die 10. Electrical routing also includes inter-die traces 254 and 255 for coupling the respective first and second faceted IC dice 10 and 20 to a third device 30. For example, the inter-die trace 254 couples the first faceted IC die 10 to the third IC die 30 within the package substrate 110, and the inter-die trace 255 couples the second faceted IC die 20 to the third IC die 30.

As the section line B-B is drawn close to the concave facets 212 and 222, the inter-die traces 254 and 255 represent shortened interconnects in breakout regions that include die-side interconnects at the concave facets.

Figure 3A:
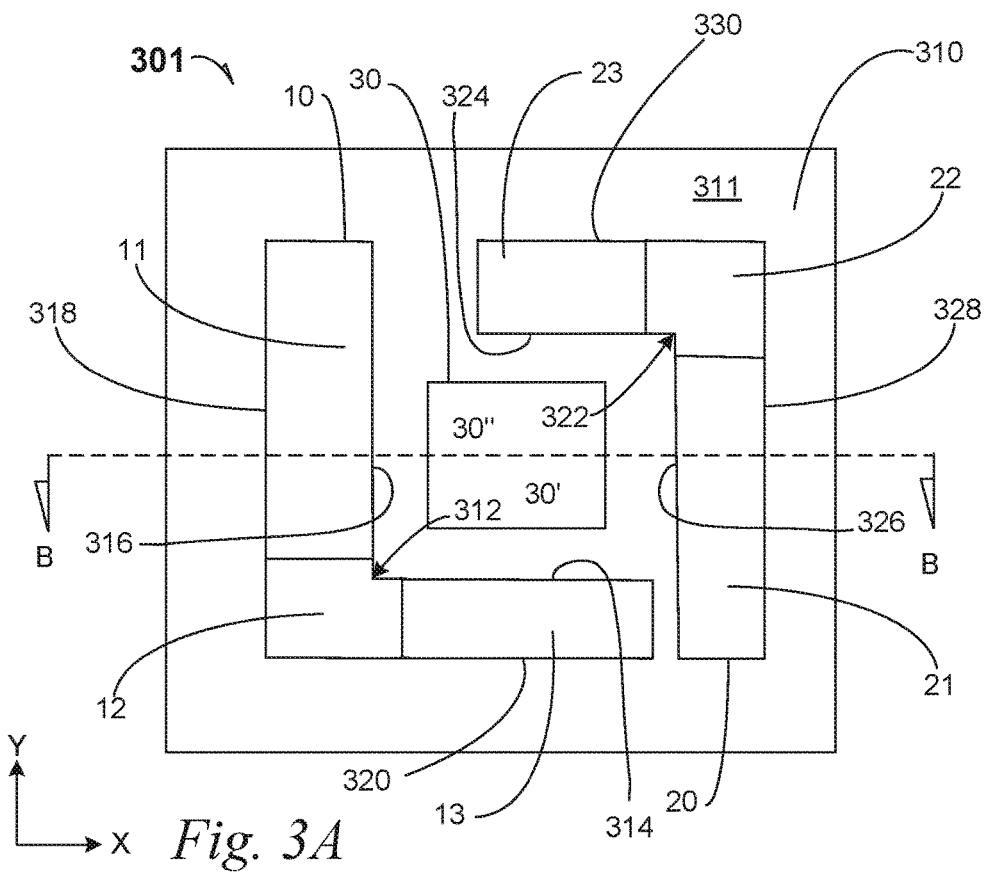
FIG. 3A is a top plan of an integrated-circuit apparatus that includes at least one faceted integrated circuit die on a package substrate according to an embodiment.

FIG. 3A is a top plan of an integrated-circuit apparatus 301 that includes at least one faceted integrated circuit die 10 on a package substrate 310 according to an embodiment. A first faceted integrated-circuit (IC) die 10 is on the semiconductor package substrate 310, on a die side 311. The first faceted IC die 10 is characterized by a concave facet 312 that is formed by the intersection of a ledge facet 314 and a main-chip facet 316. As illustrated, the main chip runs principally along the Y-direction, and the ledge runs principally in the X-direction, beyond the main chip. The main-chip facet 316 is opposite a main-chip long edge 318, and the ledge facet 314 is opposite the ledge-portion long edge 320.

In an embodiment, the first faceted IC die 10 is nested with a second faceted IC die 20. Although the second faceted IC die 20 has a concave facet 322, the first faceted IC die 10 is nested to a square or rectangular IC third die 30 with a corner being nested near the first IC die concave facet 312. Similarly, the third IC die 30 is nested to the second faceted IC die 20 with a corner being nested near the second IC die concave facet 322.

In an embodiment, the second faceted IC die 20 faceting is characterized by the concave facet 322 that is formed by the intersection of a ledge facet 324 and a main-chip facet 326. The main-chip facet 326 is opposite a main-chip long edge 328, and the ledge facet 224 is opposite a ledge-portion long edge 330.

In an embodiment, the first faceted IC die 10 includes an integral passive section 12 that includes the concave facet 312. The integral passive section 12 sets apart a first active section 11 and a second active section 13. The integral passive section 12 is part of a semiconductive material that includes the entire first faceted IC die 10, but only high-density interconnects run through the integral passive section 12, whereas active devices and metallization are found in each of the first active section 11 and the second active section 13.

In an embodiment, the second faceted IC die 20 includes an integral passive section 22 that includes the concave facet 322. The integral passive section 22 sets apart a first active section 21 and a second active section 23. In an embodiment, the faceted IC dice 10 and 20 are identical devices, one of which is rotated 180° with respect to the other. In an embodiment, the faceted IC dice 10 and 20 are different in function from each other. In an embodiment, the faceted IC dice are different in form factor, such as the ledge facet 314 is longer than the ledge facet 324.

In a system embodiment, the IC third die 30 is a platform controller hub (PCH) or a chipset such as one manufactured by Intel Corporation of Santa Clara, Calif. In an embodiment, the IC third die 30 is a graphic-processing unit (GPU). In an embodiment, the IC third die 30 is a processor core such as a logic central-processing unit (CPU). In an embodiment the first faceted. IC die 10 includes a memory processor in the first active section 11, and a logic CPU in the second active section 13, with a high-density in situ silicon bridge 12 between the respective first and second active sections 11 and 13, but the bridge 12 is semiconductive material that is an integral portion of the entire faceted IC die 10. In an embodiment, the silicon bridge 12 includes a plurality of interconnects with trace width and spacing geometry lesser than 5 μm respectively. In an embodiment, the silicon bridge 12 includes one or more metal layers that spans at least portion of the active devices and metallization layer (e.g., the active device and metallization layer 332 in FIG. 3B). In this embodiment, IC third die 30 communicates within the package substrate 310 with trace and via interconnections such as a vertical composite via 348 (see FIG. 3B), via-to-via traces 352, and inter-die traces 354.

In a system embodiment, the IC third die 30 is a platform controller hub (PCH) or a chipset such as one manufactured by Intel Corporation of Santa Clara, Calif. In an embodiment, the IC third die 30 is a sensor. In an embodiment, the second faceted IC die 20 includes a processor core such as a companion CPU that is coupled to the IC third die 30 at the first active section 21, and a graphic processor (GPU) 23 in the second active section 23, with a high-density in situ silicon bridge 22 between the respective first and second active sections 21 and 23. In an embodiment, the silicon bridge 22 includes a plurality of interconnects with trace width and spacing geometry lesser than 5 μm respectively. In an embodiment, the silicon bridge 22 includes one or more metal layers that spans at least portion of the active devices and metallization layer (e.g., the active device and metallization layer 336 in FIG. 3B). In this embodiment, IC third die 30 communicates within the package substrate 310 with trace and via interconnections such as a vertical composite via 348 (see FIG. 3B), via-to-via traces, and inter-die traces 355.

Figure 3B:
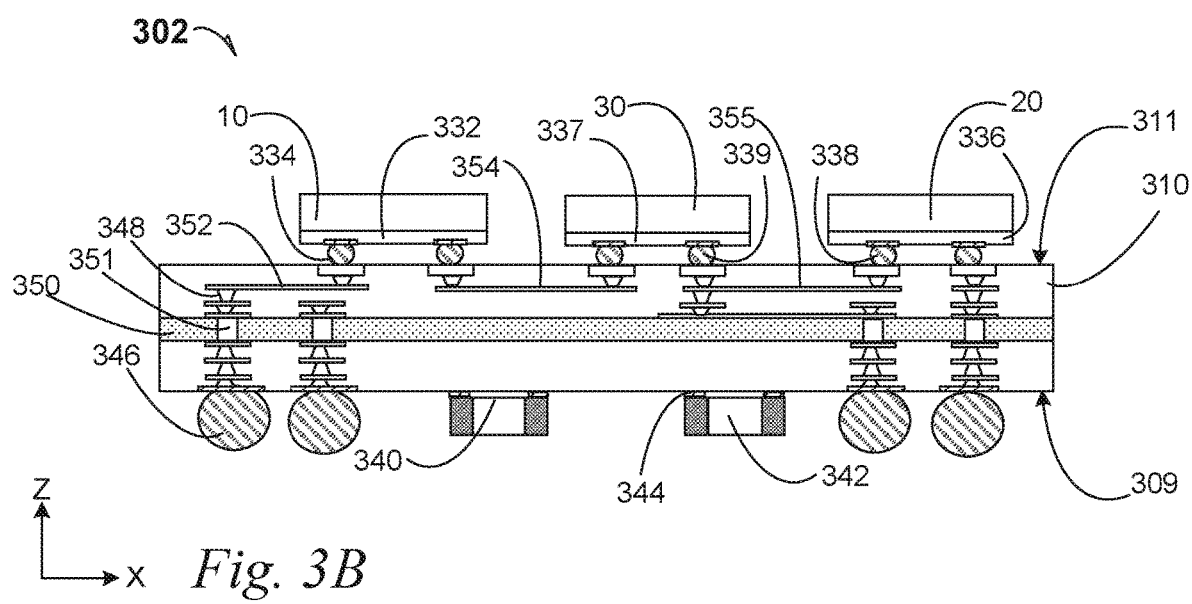
FIG. 3B is a cross-section and partial cut-away elevation of the integrated-circuit apparatus depicted in FIG. 3A according to an embodiment.

FIG. 3B is a cross-section and partial cut-away elevation 302 of the integrated-circuit apparatus 301 depicted in FIG. 3A according to an embodiment. FIG. 3B is taken from the section line B-B in FIG. 3A. In cross section, the integrated-circuit apparatus 302 depicts the first faceted IC die 10, the second faceted IC die 20 and the third IC die 30 upon the die side 311 of the package substrate 310.

The first faceted IC die 10 is seated, flip-chip style, with active devices and metallization 332 bonded through electrical bumps 334 to the die side 311. Similarly in an embodiment, the second faceted IC die 20 is seated with active devices and metallization 336 bonded through electrical bumps 338 to the die side 311. Similarly, the third IC die 30 is seated on the die side 311, with active devices and metallization 337 bonded through electrical bumps 339.

In an embodiment, passive devices such as capacitors 340 and 342 are located on a land side 309 of the package substrate 310, where the capacitors 340 and 342 are upset capacitors within or close to within the X-Y die shadow of at least one of the first faceted IC die 10, the second faceted IC die 20 and the third IC die 30.

By way of illustration, the capacitor 342 is illustrated with end electrodes or terminals (darker) and the capacitor body (lighter), and the capacitor 342 is electrically coupled by direct contact to a solder layer 344.

In cross-section and partial cut-away view of FIG. 3B, the package substrate 310 illustrates electrical routing between electrical bumps 346, such as ball-grid array electrical bumps 346 on the land side 309, and the first faceted IC die 10, the second faceted IC die 20, and the third IC die 30.

Electrical routing includes a vertical composite via 348 that may communicate between the die side 311 and the land side 309. The vertical composite via 348 includes a core via portion 351 that passes through a core section 350 of the package substrate 310 according to an embodiment. Electrical routing also includes via-to-via traces 352 that couple a land-side bump 346 to a die-side faceted IC die 10. Electrical routing also includes inter-die traces 354 and 355 for coupling the respective first and second faceted IC dice 10 and 20 to a third device 30. For example, the inter-die trace 354 couples the first faceted IC die 10 to the third IC die 30 within the package substrate 310, and the inter-die trace 355 couples the second faceted IC die 20 to the third IC die 30.

In an embodiment, the IC third die 30 supplanted by two separate chiplets that take up the infield on the die side 311, formed by the respective first and second faceted ID dices 10 and 20. For example at approximately the dashed section line B-B, the two dice are separated. Consequently, a chiplet 30' (see FIG. 3A) is a PCH or chipset 30' that accesses the logic CPU portion 13 and optionally part of the memory portion 11, and a chiplet 30" is a sensor 30" that accesses a graphic processing unit (GPU) portion 23 and a co-processor CPU portion 21. It may now be understood that at least six separate active devices may be configured by use of the dice 30', 30", and the portions 11, 13, 21 and 22, with at least two high-density in situ bridge portions 12 and 22.

Figure 4:
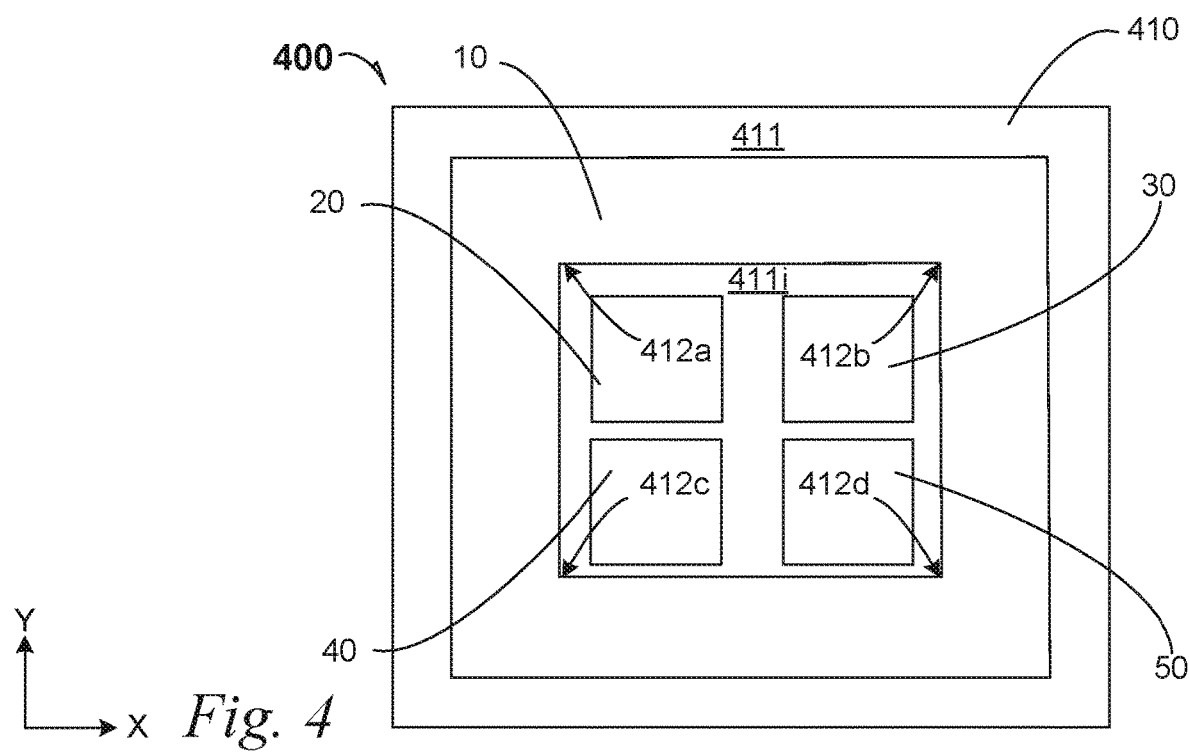
FIG. 4 is a top plan of an integrated-circuit apparatus that includes at least one faceted integrated circuit die on a package substrate according to an embodiment.

FIG. 4 is a top plan of an integrated-circuit apparatus 400 that includes at least one faceted integrated circuit die 10 on a package substrate 410 according to an embodiment. A first faceted integrated-circuit (IC) die 10 is on the semiconductor package substrate 410, on a die side 411. The first faceted IC die 10 is characterized by a concave facet 412a that is closely coupled in a faceted breakout region through the package substrate 410 to a second IC die 20, a concave facet 412b that is closely coupled in a faceted breakout region to a third IC die 30, a concave facet 412c that is closely coupled in a faceted breakout region to a fourth IC die 40, and a concave facet 412d that is closely coupled in a faceted breakout region to a fifth IC die 50.

As illustrated, the faceted IC die 10, runs principally as a perimeter-faceted IC die 10, with an infield region demarcated by the item 4111, which is an exposed portion of the package substrate die side 411.

In a system embodiment, the faceted IC die 10 is a platform-controller hub (PCH) 10, and the several respective IC dice 20, 30, 40 and 50 are disaggregated CPU chiplets that are coupled to the faceted IC die 10 through the package substrate 410, such as composite vias (see, e.g. composite via 348 in FIG. 3B) as well as via-to-via traces 352 (FIG. 3B), and inter-die traces 354.

Figure 5:
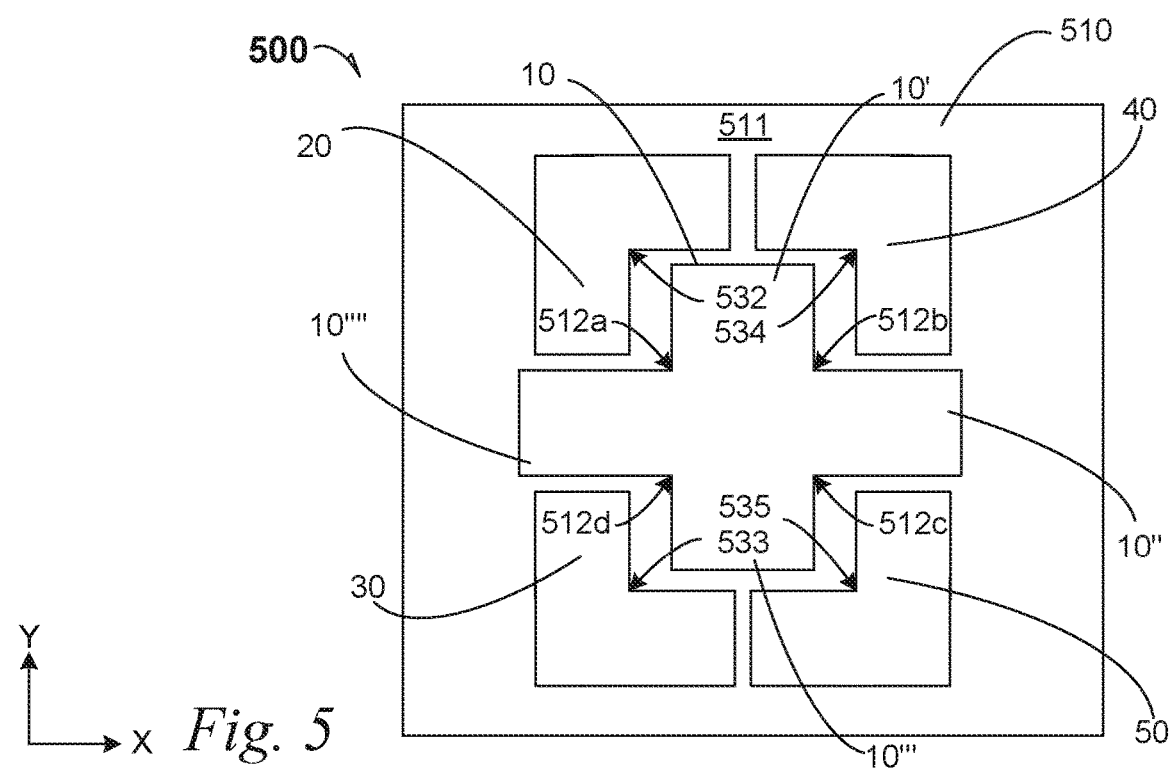
FIG. 5 is a top plan of an integrated-circuit apparatus that includes at least one faceted integrated circuit die on a package substrate according to an embodiment.

FIG. 5 is a top plan of an integrated-circuit apparatus 500 that includes at least one faceted integrated circuit die 10 on a package substrate 510 according to an embodiment. A first faceted integrated-circuit (IC) die 10 is on the semiconductor package substrate 510, on a die side 511. The first faceted IC die 10 has a cross-shaped form factor that has quadruple concave faceting. The quadruple concave faceting is characterized by at least four concave facets 512a, 512b, 512c and 512d. The cross form factor may be characterized by a main chip section that is the center of the cross, and four ledge sections that emanate from the center. Consequently, a first ledge section 10' emerges from concave facets 512a and 512b, a second ledge section 10" emerges from concave facets 512b and 512c, a third ledge section 10''' emerges from concave facets 512c and 512d, and a fourth ledge section 10'''' emerges from concave facets 512d and 512a. In an embodiment, the first ledge section 10' is not present, and the faceted IC die 10 has a "T" form factor.

In an embodiment, the first faceted IC die 10 is nested with a second faceted IC die 20 that has a concave facet 532. The concave facet 532 of the second faceted IC die 20 nests in part with the first ledge section 10' of the first faceted IC die 10.

In an embodiment, the first faceted IC die 10 is nested with a third faceted IC die 30 that has a concave facet 533. The concave facet 533 of the third faceted IC die 30 nests in part with the third ledge section 10''' of the first faceted IC die 10.

In an embodiment, the first faceted IC die 10 is nested with a fourth faceted IC die 40 that has a concave facet 534. The concave facet 534 of the fourth faceted IC die 40 nests in part with the first ledge section 10' of the first faceted IC die 10.

In an embodiment, the first faceted IC die 10 is nested with a fifth faceted IC die 50 that has a concave facet 535. The concave facet 535 of the fifth faceted IC die 50 nests in part with the second ledge section 10" and the third ledge section 10''' of the first faceted IC die 10.

In an embodiment, the faceted IC die 10 is a CPU 10, and the several respective faceted IC dice 20, 30, 40 and 50 are specialty chiplets. For example, the second faceted IC die 20 is a GPU 20. Further, the third faceted IC die 30 is a field programmable gate array (FPGA) 30. Further, the fourth faceted IC die 40 is a platform-controller hub (PCH) 40. Further, the fifth faceted IC die 50 is a memory die 50.

In and embodiment, the several dice 20, 30, 40 and 50 are coupled to the faceted IC die 10 through the package substrate 510, such as composite vias (see, e.g. composite via 348 in FIG. 3B) as well as via-to-via traces 352 (FIG. 3B), and inter-die traces 354.

Figure 6:
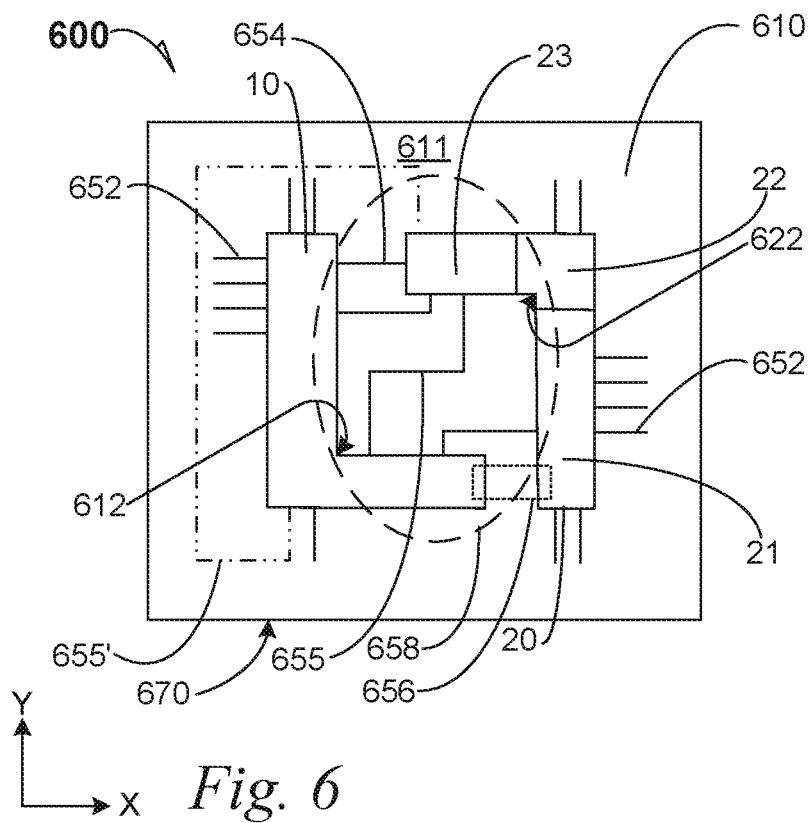
FIG. 6 is a top plan of an integrated-circuit apparatus that includes at least one faceted integrated circuit die on a package substrate according to an embodiment.

FIG. 6 is a top plan of an integrated-circuit apparatus that includes at least one faceted integrated circuit die 10 on a package substrate 610 according to an embodiment. A first faceted integrated-circuit (IC) die 10 is on the semiconductor package substrate 610, on a die side 611. The first faceted IC die 10 is characterized by a concave facet 612. In an embodiment, the first faceted IC die 10 is nested with a second faceted IC die 20. In an embodiment, the second faceted IC die 20 faceting is characterized by a concave facet 622.

In an embodiment, the second faceted IC die 20 includes an integral passive section 22 that includes the concave facet 622. The integral passive section 22 sets apart a first active section 21 and a second active section 23. In this embodiment, the respective first and second faceted dice 10 and 20 communicate within the package substrate 610 with trace and via interconnections, such as a vertical composite via 348 (see FIG. 3B). As depicted, a via-to-via trace 652 is coupled to the first faceted IC die 10, and an inter-die trace 654 couples the first faceted IC die 10 to the second faceted. IC die 20. Similarly, a via-to-via trace 652 is coupled to the second faceted IC die 20, and an inter-die trace 655 zig-zag couples the second faceted IC die 20 to the first faceted IC die 10.

In an embodiment, an embedded multi-die interconnect bridge (EMIB) 656 is embedded within the package substrate 610, and it couples the first faceted IC die 10 to the second faceted IC die 20.

In an embodiment, a multi-facet breakout region 658 exists between the first faceted IC die 10 and the second faceted IC die 20 upon the die side 611 in an infield region between the respective IC dice 10 and 20. Were the several dice 10 and 20 square or rectangular, the inter-die trace 655 would likely need to exit a rectangular IC die near a package substrate edge 670, as an inter-die trace 655', and loop around the package substrate 610 along edges like the edge 670 until it could insert at second rectangular IC die. Consequently insertion loss and signal integrity would both be less useful, compared to a signal conveyed on the inter-die trace 655 within the multi-facet breakout region 658.

Figure 7:
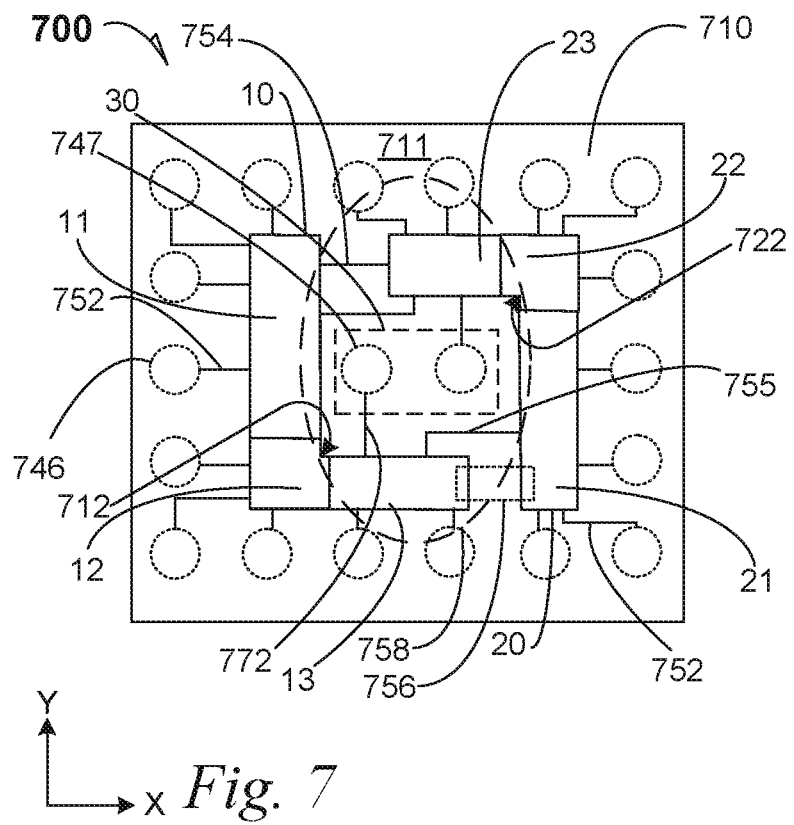
FIG. 7 is a top plan of an integrated-circuit apparatus that includes at least one faceted integrated circuit die on a package substrate according to an embodiment.

FIG. 7 is a top plan of an integrated-circuit apparatus that includes at least one faceted integrated circuit die 10 on a package substrate 710 according to an embodiment. A first faceted integrated-circuit (IC) die 10 is on the semiconductor package substrate 710, on a die side 711. The first faceted IC die 10 is characterized by a concave facet 712. In an embodiment, the first faceted IC die 10 is nested with a second faceted IC die 20. In an embodiment, the second faceted IC die 20 faceting is characterized by a concave facet 722.

In an embodiment, the first faceted IC die 10 includes an integral passive section 12 that includes the concave facet 712. The integral passive section 12 sets apart a first active section 11 and a second active section 13. The second faceted IC die 20 includes an integral passive section 22 that includes the concave facet 712. The integral passive section 22 sets apart a first active section 21 and a second active section 23. In this embodiment, the respective first and second faceted dice 10 and 20 communicate within the package substrate 710 with trace and via interconnections, such as a vertical composite via 348 (see FIG. 3B). As depicted, a via-to-via trace 752 is coupled between a land side bump 746 (depicted in ghosted circles), similar to the ball-grid array electrical bumps 146 depicted in FIG. 1B, and the first faceted IC die 10. An inter-die trace 754 couples the first faceted IC die 10 at the first active section 11 to the second faceted IC die 20 at the second active section 23. Similarly, a via-to-via trace 752 is coupled to the second faceted IC die 20, and an inter-die trace 755 couples the second faceted IC die 20 at the first active section at the first active section 21 to the first faceted IC die 10 at the second active section 13.

In an embodiment, an embedded multi-die interconnect bridge (EMIB) 756 is embedded within the package substrate 710, and it couples the first faceted IC die 10 to the second faceted IC die 20.

In an embodiment, a multi-facet breakout region 758 exists between the first faceted IC die 10 and the second faceted IC die 20 upon the die side 711 in an infield region between the respective IC dice 10 and 20. In contrast with a zig-zag die-to-die trace 655 depicted in FIG. 6, a die-to-via trace 772 couples the first faceted IC die 10 to a land-side bump 747 that is within the breakout region 758, and an optional third IC die 30 (in ghosted lines to illustrate a die 30 footprint) is found in the infield between the respective IC dice 10 and 20. Consequently insertion loss and signal integrity by communication between the first faceted IC die 10 and the second faceted IC die 20 by communicating through the land-side bump 747 within the multi-facet breakout region 758.

Figure 8A:
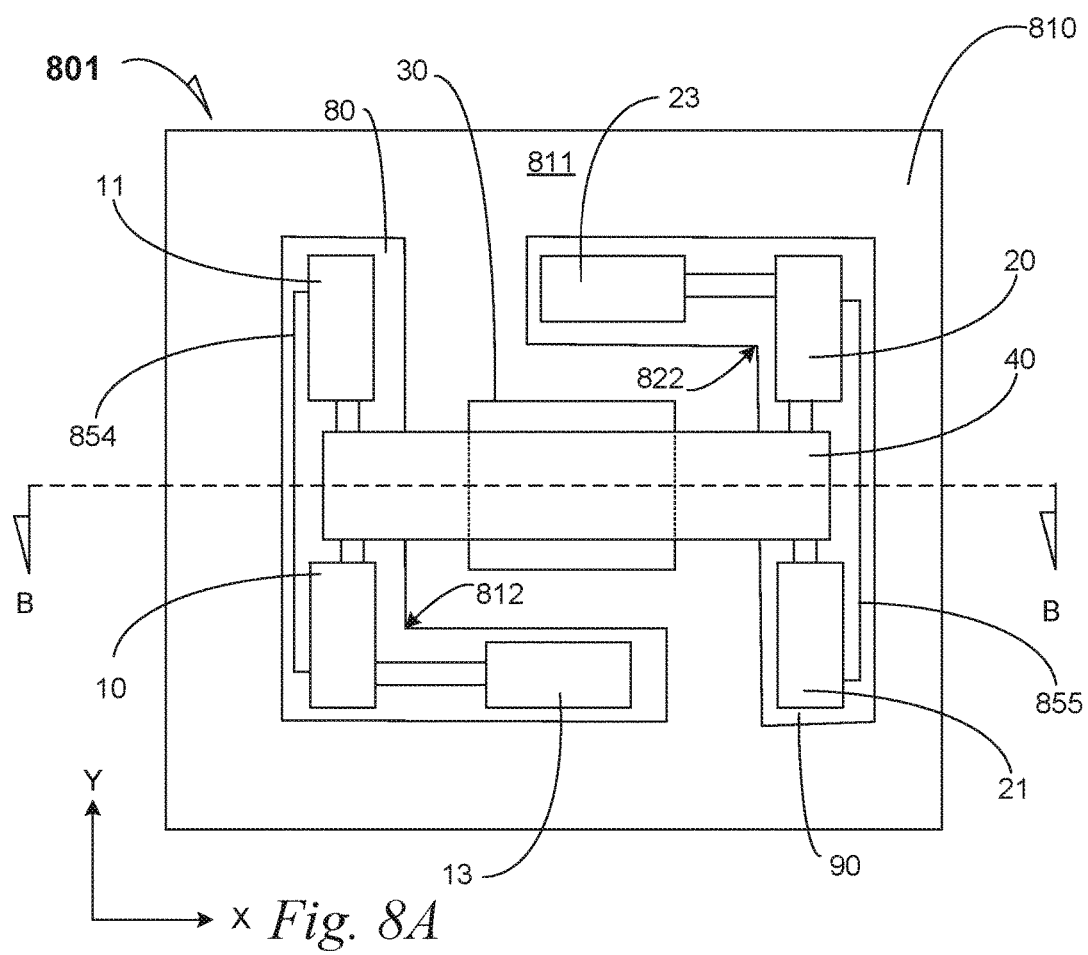
FIG. 8A is a top plan of an integrated-circuit apparatus that includes at least one faceted silicon interposer on a package substrate according to an embodiment.

FIG. 8A is a top plan of an integrated-circuit apparatus 801 that includes at least one faceted silicon interposer 80 on a package substrate 810 according to an embodiment. A first faceted silicon interposer 80 is on the semiconductor package substrate 810, on a die side 811. The first faceted silicon interposer 80 is selected from doped silicon, undoped silicon, and III-V semiconductive material according to an embodiment. In an embodiment, the first faceted interposer 80 is made from a glass material such as an aluminosilicate material. In an embodiment, the first faceted interposer 80 includes an aluminosilicate composition with an additive of potassium. In an embodiment, the first faceted interposer 80 includes an aluminosilicate composition with an additive of magnesium. In an embodiment, the first faceted interposer 80 includes an aluminosilicate composition with an additive of sodium. In an embodiment, the first faceted interposer 80 includes an aluminosilicate composition with an additive of at least two of potassium, magnesium and sodium. The first faceted interposer 80 is characterized by a concave facet 812

Hereinafter, any given faceted interposer such as the faceted interposer 80 may be selected from semiconductive material or silicon-based material, and referred to generically as a "faceted silicon interposer", but specific embodiments may call out semiconductive material. Similarly in an embodiment, specific embodiments may call out glass-based material such as a silica composition or an aluminosilicate composition.

In an embodiment, the first faceted silicon interposer 80 is nested with a second faceted silicon interposer 90. Although the second faceted silicon interposer 90 has a concave facet 822, the first faceted silicon interposer is nested to a square or rectangular IC die 30 with a corner being nested near the first concave facet 812. Similarly, the IC die 30 is nested to the second faceted silicon interposer 90 with a corner being nested near the second concave facet 822.

In an embodiment, the first faceted silicon interposer 80 includes a passive section that is a silicon bridge similar to the silicon bridge 12 embodiments described and illustrated in FIG. 3A. In an embodiment, the silicon bridge includes a plurality of interconnects with trace width and spacing geometry lesser than 5 μm respectively. In an embodiment, the silicon bridge includes one or more passive metal and dielectric layers.

In a system embodiment, the IC die 30 is a processor core such as a logic central-processing unit (CPU) such as one manufactured by Intel Corporation of Santa Clara, Calif. In an embodiment, the IC die 30 is a graphic-processing unit (GPU).

In an embodiment the first faceted silicon interposer 80 supports a first IC die 10 near the concave facet 812, an IC die 11 near one end of the first faceted silicon interposer 80, and an IC die 13 near the other end of the first faceted silicon bridge interposer 80. In an embodiment the second faceted silicon interposer 90 supports a second IC die 20 near the concave facet 822, an IC die 21 near one end of the second faceted silicon interposer 90, and an IC die 23 near the other end of the second faceted silicon bridge interposer 90.

A first active bridge die 40 spans the first faceted silicon bridge interposer 80, the IC die 30 and the second faceted silicon bridge interposer 90.

In a chipset embodiment, the IC die 30 is a platform-controller hub (PCH) or chipset 30, the IC dice 10 and 11 are memory dice, and the IC die 13 is a CPU core chip-let 13. In a chipset embodiment, the IC die 30 is a PCH or chipset 30, the IC dice die 20 and 21 are graphic processor units (CPUs), and the IC die 23 is a CPU core chiplet 23. For these chipset embodiments, the active bridge IC die 40 is a processor core such as a logic central-processing unit (CPU) such as one manufactured by Intel Corporation of Santa Clara, Calif. that complements the CPU core chiplets 13 and 23.

In this embodiment, the PCH 30 is face-to-face with the active bridge IC die 40 and communication is rapid compared to a chipset where a PCH is on a die side of a package substrate, and the CPU is also on the die side of the package substrate and communication therebetween is through traces and vias in the package substrate. In this embodiment, the communication between the PCH 30 and the active bridge IC die 40 is rapid compared to a conventional non-faceting silicon interposer application (e.g., a PCH on a die side of a package substrate communicates to a CPU disposed on the silicon interposer through traces and vias in the package substrate and the silicon interposer metallization). In an embodiment, the faceted silicon bridge interposers 80 and 90 provide a compact package footprint dimensions for a multiple-chip package.

In an embodiment, IC dice 10 and 11 communicate with inter-die traces, e.g. 854 that are in metallization on the first faceted silicon interposer 80. In an embodiment, IC dice 20 and 21 communicate with inter-die traces, e.g. 855 that are in metallization on the second faceted silicon interposer 90. In an embodiment, the active bridge IC die 40 communicates with the IC dice 13 and 23 (e.g., the companion CPU core chiplets 13 and 23) through inter-die traces similar to inter-die traces 854 and 855.

Figure 8B:
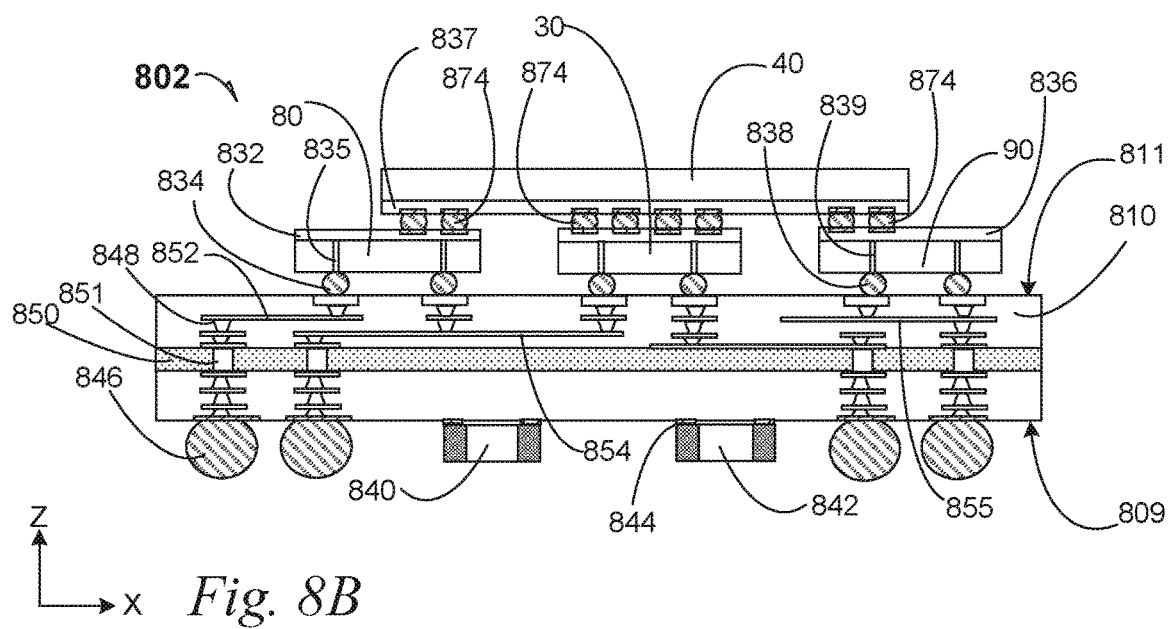
FIG. 8B is a cross-section and partial cut-away elevation of the integrated-circuit apparatus depicted in FIG. 8A according to an embodiment.

FIG. 8B is a cross-section and partial cut-away elevation 802 of the integrated-circuit apparatus 801 depicted in FIG. 8A according to an embodiment. FIG. 8B is taken from the section line B-B in FIG. 8A. In cross section, the integrated-circuit apparatus 802 depicts the first faceted silicon interposer 80, the second faceted silicon interposer 90, the IC die 30 upon the die side 811 of the package substrate 810, and the bridge IC die 40.

The first faceted silicon interposer 80 is seated on the die side 811 with metallization 832 bonded through electrical bumps 334 and through-interposer vias (TIVs) 835 to the die side 811. Similarly in an embodiment, the second faceted silicon interposer 90 is seated on the die side 811, with metallization 836 bonded through electrical humps 838 and TIVs 839 to the die side 811. Similarly, the IC die 30 is seated with active devices and metallization that are face-to-face coupled with active devices and metallization 837 on the active bridge IC die 40 by use of micro bumps 874. Similarly, the metallizations 832 and 836 are face-to-face coupled to active devices and metallization 837 on the active bridge IC die 40 by use of micro bumps 874. In an embodiment, at least a portion of the TIVs 835, 839 comprises an electrical conductive layer such as copper, aluminum, gold or silver metal layer.

In an embodiment, passive devices such as capacitors 840 and 842 are located on a land side 809 of the package substrate 810, where the capacitors 840 and 842 are upset capacitors within or close to within the X-Y die shadow of the IC die 30 or the active bridge IC die 40.

By way of illustration, the capacitor 842 is illustrated with end electrodes or terminals (darker) and the capacitor body (lighter), and the capacitor 842 is electrically coupled by direct contact to a solder layer 844.

In cross-section and partial cut-away view of FIG. 8B, the package substrate 810 illustrates electrical routing between electrical bumps 846, such as ball-grid array electrical bumps 846 on the land side 809, and the first faceted silicon interposer 80, the second faceted silicon interposer 90, and the IC die 30.

Electrical routing includes a vertical composite via 848 that may communicate between the die side 811 and the land side 809. The vertical composite via 848 includes a core via portion 851 that passes through a core section 850 of the package substrate 810 according to an embodiment. Electrical routing also includes via-to-via traces 852 that couple a land-side bump 846 to the die-side faceted silicon interposer 80. Electrical routing also includes inter-die traces 854 and 855 for coupling the respective first and second faceted silicon bridges 80 and 90 to the IC device 30. For example, the inter-die trace 854 couples the first faceted silicon interposer 80 to the IC die 30 within the package substrate 810, and the inter-die trace 855 couples the second faceted silicon interposer 90 to the IC die 30.

Figure 9A:
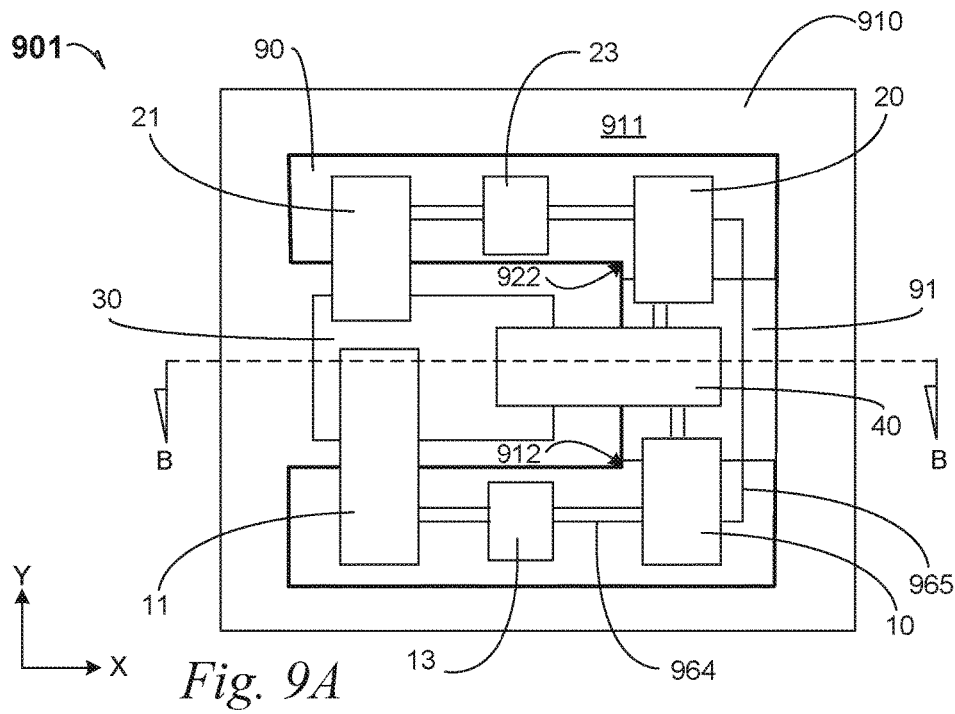
FIG. 9A is a top plan of an integrated-circuit apparatus that includes at least one faceted silicon interposer on a package substrate according to an embodiment.

FIG. 9A is a top plan of an integrated-circuit apparatus 901 that includes at least one faceted silicon interposer 90 on a package substrate 910 according to an embodiment. A faceted silicon interposer 90 is on the semiconductor package substrate 910, on a die side 911. The faceted silicon interposer 90 is selected from doped silicon, undoped silicon, and III-V semiconductive material according to an embodiment. In an embodiment, the faceted interposer 90 is made from a glass material such as an aluminosilicate material. In an embodiment, the faceted interposer 90 includes an aluminosilicate composition with an additive of potassium. In an embodiment, the faceted interposer 90 includes an aluminosilicate composition with an additive of magnesium. In an embodiment, the faceted interposer 90 includes an aluminosilicate composition with an additive of sodium. In an embodiment, the faceted interposer 90 includes an aluminosilicate composition with an additive of at least two of potassium, magnesium and sodium. The faceted silicon interposer 90 is characterized by concave facets 912 and 922.

Hereinafter, any given faceted interposer such as the faceted interposer 90, may be selected from semiconductive material or silicon-based material, and referred to generically as a "faceted silicon interposer", but specific embodiments may call out semiconductive material. Similarly in an embodiment, specific embodiments may call out glass-based material such as a silica composition or an aluminosilicate composition.

In an embodiment, the faceted silicon interposer 90 includes an active IC section 91 that is an in situ semiconductive device that is an integral structure with the entire faceted silicon interposer 90.

In a system embodiment, the IC die 40 is a processor core such as a logic central-processing unit (CPU) such as one manufactured by Intel Corporation of Santa Clara, Calif. The CPU IC die 40 is mounted face-to-face with a PCH die 30 that is seated on the die side 911 of the package substrate 910. In an embodiment the faceted silicon interposer 90 supports a first IC die 10 near the concave facet 912, an IC die 11 near one end of the faceted silicon interposer 90, and an IC die 13 between the IC dice 10 and 11. The faceted silicon interposer 90 supports a second IC die 20 near the concave facet 922, an IC die 21 near one end of the second faceted silicon interposer 90, and an IC die 23 between the IC dice 20 and 21.

The active bridge die 40 spans from the faceted silicon bridge interposer 90, and the IC die 30.

In a chipset embodiment, the IC die 30 is a platform-controller hub (PCH) or chipset 30, the first IC die 10 is a graphic processing unit (GPU) die 10, the IC die 11 is a companion CPU core chiplet 11 and the IC die 13 is a memory die 13. In a chipset embodiment, the IC die 30 is a PCH or chipset 30, the IC die 20 is a memory die 20, the IC die 21 is a companion CPU core chiplet 21 that supports the processor die 40, and the IC die 23 is a GPU die 21. In this embodiment, the PCH 30 is face-to-face with the active bridge IC die 40, the companion CPU core chiplets 11 and 22, and communication is rapid compared to a chipset where a PCH is on a die side of a package substrate, and the CPU is also on the die side of the package substrate and communication therebetween is through traces and vias in the package substrate. In this embodiment, the communication between the PCH 30 and the active bridge IC die 40 is rapid compared to a conventional non-faceting silicon interposer application (e.g., a PCH on a die side of a package substrate communicates to a CPU disposed on the silicon interposer through traces and vias in the package substrate and the silicon interposer metallization). In an embodiment, the faceted silicon bridge interposer 90 provides a compact package footprint dimensions for a multiple-chip package. In an embodiment, the absence of at least a portion of the faceted silicon bridge interposer provides real-estate clearance for package traces to breakout from the IC die 30 to avoid package layer count increase.

In an embodiment, IC dice 10 and 13 communicate with bridge inter-die traces, e.g. 964 that are in metallization on the faceted silicon interposer 90. In an embodiment, IC dice 10 and 20 communicate with bridge inter-die traces, e.g. 965 that are in metallization on the faceted silicon interposer 90.

Figure 9B:
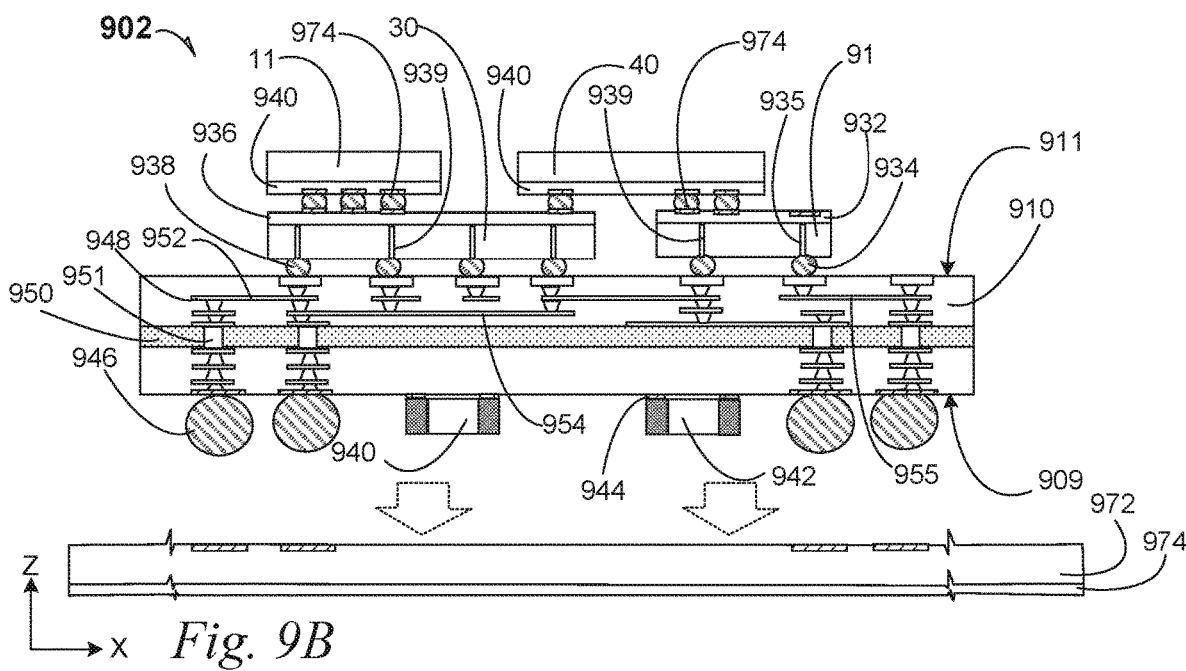
FIG. 9B is a cross-section and partial cut-away elevation of the integrated-circuit apparatus depicted in FIG. 9A according to an embodiment.

FIG. 9B is a cross-section and partial cut-away elevation 902 of the integrated-circuit apparatus 901 depicted in FIG.

9A according to an embodiment. FIG. 9B is taken from the section line B-B in FIG. 9A. In cross section, the integrated-circuit apparatus 902 depicts the faceted silicon interposer 90 and the IC die 30 upon the die side 911 of the package substrate 910.

The faceted silicon interposer 90 is depicted at an active-device area 91 (see FIG. 9A), and it is seated on the die side 911 with active devices and metallization 932 bonded through electrical bumps 934 and through-interposer vias (TIVs) 935 to the die side 911.

Similarly in an embodiment, the IC die 30 is seated on the die side 911, with active devices and metallization 936 bonded through electrical humps 938 and TIVs 939 to the die side 911.

Similarly, the IC die 11 is seated with active devices and metallization 940, face-to-face coupled with metallization 936 by micro bumps 974 to the IC die 30.

Similarly, the active bridge IC die 40 is face-to-face coupled to both the IC die 30 and to the faceted silicon interposer 91 by use of micro bumps 974. Similarly, the metallizations 932 and 936 are face-to-face coupled to active devices and metallization 940 on the active bridge IC die 40 by use of micro bumps 974. Communication between the package substrate 910 at the die side 911, and the devices 11 and 40, is accomplished by TIVs 939. In an embodiment, the communication between IC dice 10, 11, 13, 20, 12 and 23, and the package substrate 910 at the die side 911, is accomplished by TIVs 939 in the faceted silicon bridge interposer 90.

In an embodiment, passive devices such as capacitors 940 and 942 are located on a land side 909 of the package substrate 910, where the capacitors 940 and 942 are upset capacitors within or close to within the X-Y die shadows of the IC die 30 and the IC die 40.

By way of illustration, the capacitor 942 is illustrated with end electrodes or terminals (darker) and the capacitor body (lighter), and the capacitor 942 is electrically coupled by direct contact to a solder layer 944.

In cross-section and partial cut-away view of FIG. 9B, the package substrate 910 illustrates electrical routing 952 between electrical humps 946, such as ball-grid array electrical bumps 946 on the land side 909, and the faceted silicon interposer 90 and the IC die 30.

Electrical routing includes a vertical composite via 948 that may communicate between the die side 911 and the land side 909. The vertical composite via 948 includes a core via portion 951 that passes through a core section 950 of the package substrate 910 according to an embodiment. Electrical routing also includes via-to-via traces 952 that couple a land-side bump 946 to the IC die 30. Electrical routing also includes inter-die traces 954 and 955 for coupling the IC die 30 and the faceted silicon bridge 91. For example, the inter-die trace 954 couples the faceted silicon interposer 90 to the IC die 30 within the package substrate 910, and the trace 955 couples the active-device portion 91 of the faceted silicon interposer 90 to the land side 909.

In an embodiment, the ball-grid array electrical bumps 946 on the land side 909 are bonded to a board 972 such as a motherboard 972 as part of a computing system. In an embodiment, the board 972 has an external shell 974 that is the external casing of a computing system such as a handheld computing device. In an embodiment, the board 972 supports a chipset such as that disclosed with respect to FIG. 12.

Figure 10:
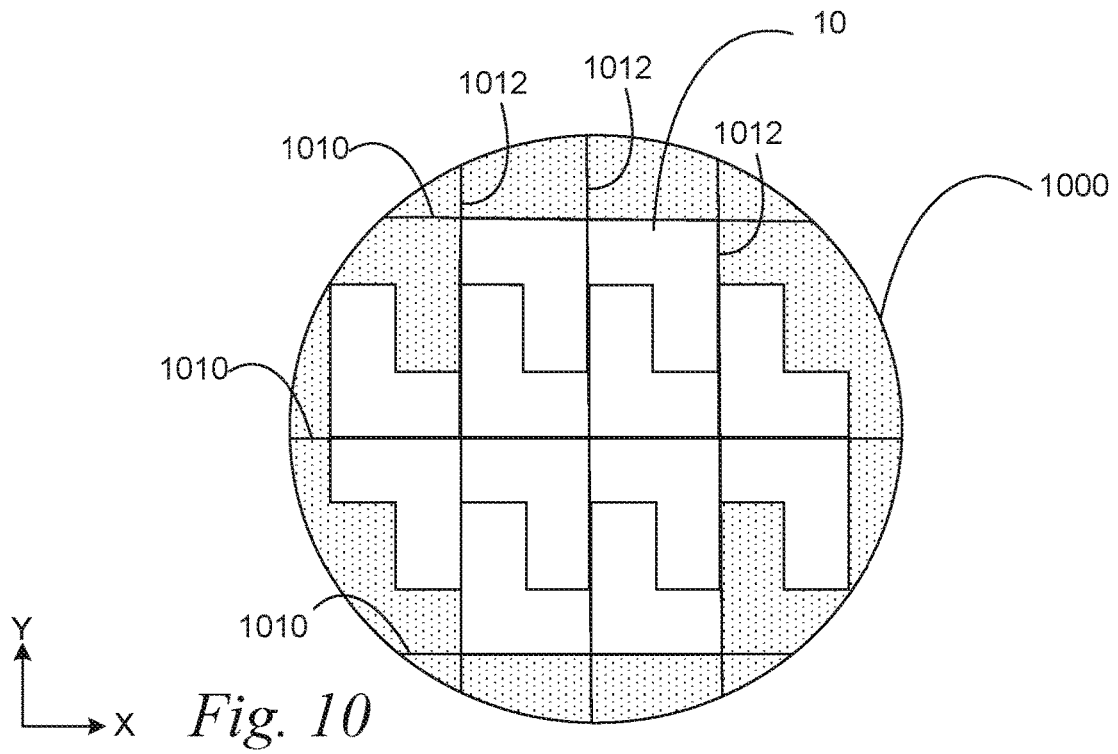
FIG. 10 is a top plan of a processed wafer during dicing according to an embodiment.

FIG. 10 is a top plan of a processed wafer 1000 during dicing according to an embodiment. A faceted IC die 10 is being singulated from the wafer 1000 after semiconductor front-end processing, and after metallization back-end processing. In an embodiment, X-direction scribe streets 1010 and Y-direction scribe streets 1012 are partially completed, followed by laser scribing where faceted portions of the IC die 10 do not allow trans-wafer scribing.

Figure 11:
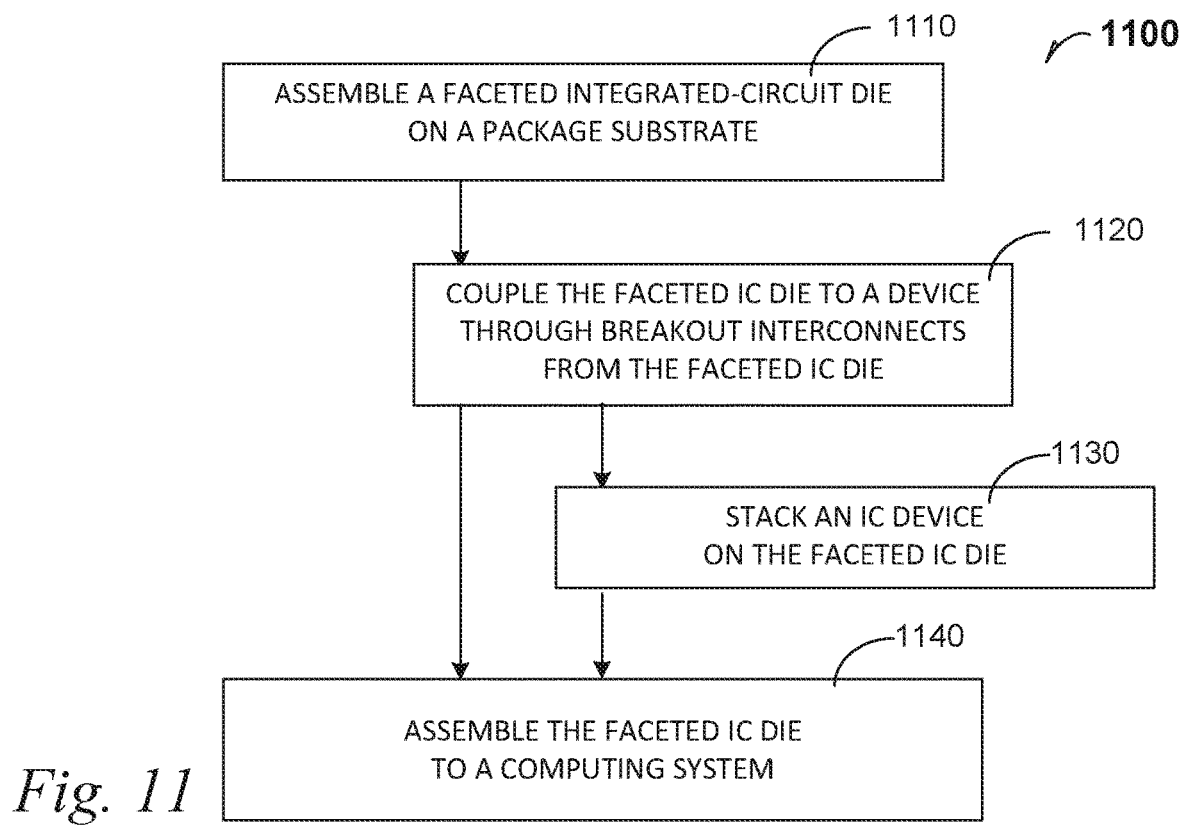
FIG. 11 is a process flow diagram according to several embodiments.

FIG. 11 is a process flow diagram 1100 according to several embodiments.

At 1110, the process includes assembling a faceted IC die on a package substrate. In a non-limiting example embodiment, the faceted IC die 10 is assembled to the package substrate 110. In a non-limiting example embodiment, a faceted silicon interposer 80 is assembled to the package substrate 810.

At 1120, the process includes coupling the faceted IC die to a device through breakout interconnects from the faceted IC die. In a non-limiting example embodiment, the faceted IC die 23 depicted in FIG. 6, is coupled to a device 10 by a breakout interconnect 655 in the package substrate 610.

At 1130, the process includes stacking an IC device on the faceted IC die. In a non-limiting example embodiment, the 1C die 23 is stacked on the faceted silicon interposer 90 as depicted in FIG. 8A.

At 1140, the process includes assembling the faceted IC die to a computing system.

Figure 12:
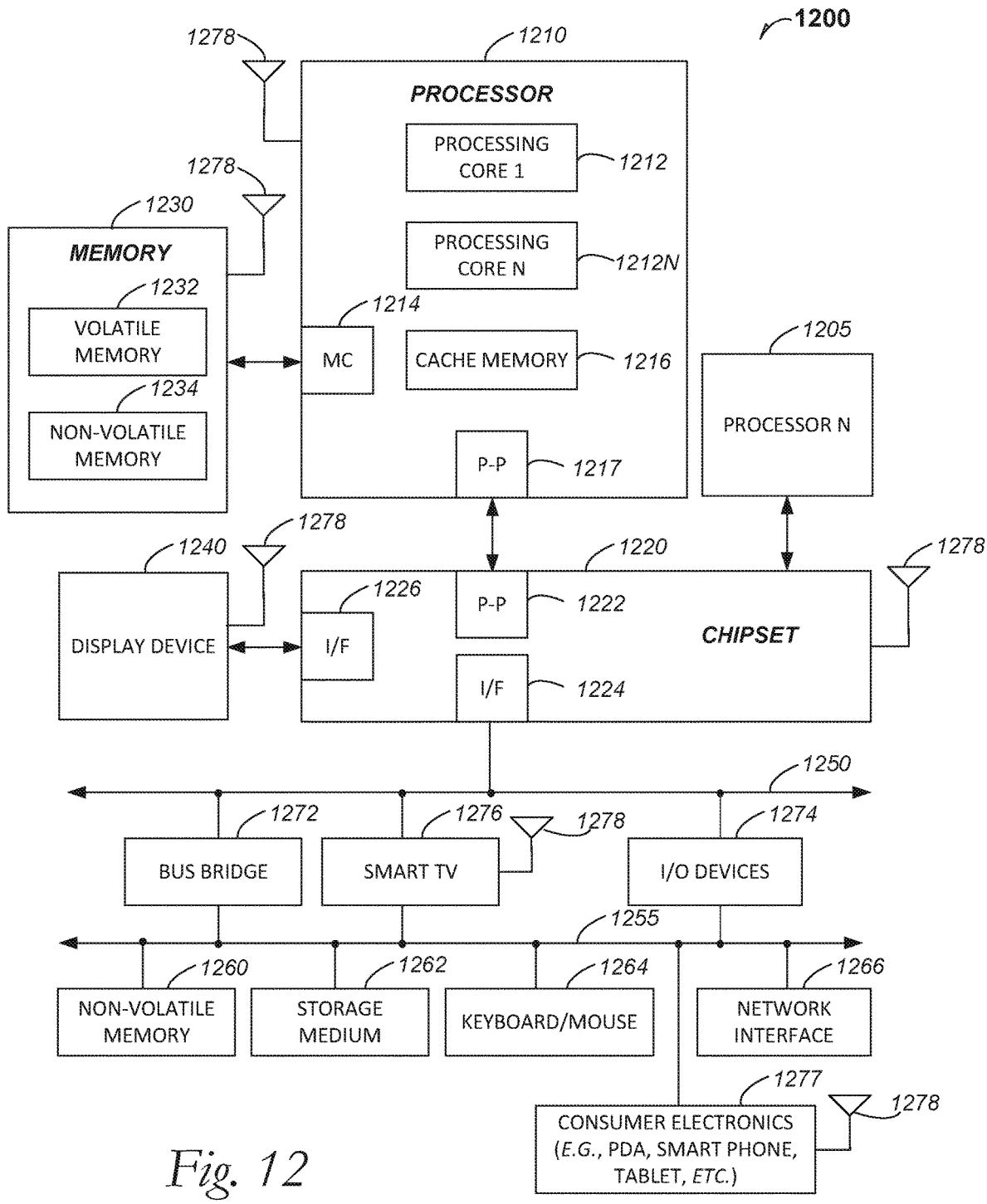
FIG. 12 is included to show an example of a higher-level device application for the disclosed embodiments.

FIG. 12 is included to show an example of a higher-level device application for the disclosed embodiments. The faceted IC die with facet breakouts embodiments may be found in several parts of a computing system. In an embodiment, the faceted IC die with facet breakouts semiconductor apparatus is part of a communications apparatus such as is affixed to a cellular communications tower. In an embodiment, a computing system 1200 includes, but is not limited to, a desktop computer. In an embodiment, a system 1200 includes, but is not limited to a laptop computer. In an embodiment, a system 1200 includes, but is not limited to a netbook. In an embodiment, a system 1200 includes, but is not limited to a tablet. In an embodiment, a system 1200 includes, but is not limited to a notebook computer. In an embodiment, a system 1200 includes, but is not limited to a personal digital assistant (PDA). In an embodiment, a system 1200 includes, but is not limited to a server. In an embodiment, a system 1200 includes, but is not limited to a workstation. In an embodiment, a system 1200 includes, but is not limited to a cellular telephone. In an embodiment, a system 1200 includes, but is not limited to a mobile computing device. In an embodiment, a system 1200 includes, but is not limited to a smart phone. In an embodiment, a system 1200 includes, but is not limited to an internet appliance. Other types of computing devices may be configured with the microelectronic device that includes faceted IC die with facet breakouts embodiments.

In an embodiment, the processor 1210 has one or more processing cores 1212 and 1212N, where 1212N represents the Nth processor core inside processor 1210 where N is a positive integer. In an embodiment, the electronic device system 1200 using a faceted IC die with facet breakouts embodiment that includes multiple processors including 1210 and 1205, where the processor 1205 has logic similar or identical to the logic of the processor 1210. In an embodiment, the processing core 1212 includes, but is not limited to, pre-fetch logic to fetch instructions, decode logic to decode the instructions, execution logic to execute instructions and the like. In an embodiment, the processor 1210 has a cache memory 1216 to cache at least one of instructions and data for the MAA apparatus in the system

1200. The cache memory 1216 may be organized into a hierarchal structure including one or more levels of cache memory.

In an embodiment, the processor 1210 includes a memory controller 1214, which is operable to perform functions that enable the processor 1210 to access and communicate with memory 1230 that includes at least one of a volatile memory 1232 and a non-volatile memory 1234. In an embodiment, the processor 1210 is coupled with memory 1230 and chipset 1220. The processor 1210 may also be coupled to a wireless antenna 1278 to communicate with any device configured to at least one of transmit and receive wireless signals. In an embodiment, the wireless antenna interface 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1234 includes, but is not limited to, flash memory, phase change memory (PCM), read-only memory (ROM), electrically erasable programmable read-only memory (EEPROM), or any other type of non-volatile memory device.

The memory 1230 stores information and instructions to be executed by the processor 1210. In an embodiment, the memory 1230 may also store temporary variables or other intermediate information while the processor 1210 is executing instructions. In the illustrated embodiment, the chipset 1220 connects with processor 1210 via Point-to-Point (PtP or P-P) interfaces 1217 and 1222. Either of these PtP embodiments may be achieved using a faceted IC die with facet breakouts embodiment as set forth in this disclosure. The chipset 1220 enables the processor 1210 to connect to other elements in the faceted IC die with facet breakouts embodiments in a system 1200. In an embodiment, interfaces 1217 and 1222 operate in accordance with a PtP communication protocol such as the Intel® QuickPath Interconnect (QPI) or the like. In other embodiments, a different interconnect may be used.

In an embodiment, the chipset 1220 is operable to communicate with the processor 1210, 1205N, the display device 1240, and other devices 1272, 1276, 1274, 1260, 1262, 1264, 1266, 1277, etc. The chipset 1220 may also be coupled to a wireless antenna 1278 to communicate with any device configured to at least do one of transmit and receive wireless signals.

The chipset 1220 connects to the display device 1240 via the interface 1226. The display 1240 may be, for example, a liquid crystal display (LCD), a plasma display, cathode ray tube (CRT) display, or any other form of visual display device. In an embodiment, the processor 1210 and the chipset 1220 are merged into a faceted IC die with facet breakouts in a system. Additionally, the chipset 1220 connects to one or more buses 1250 and 1255 that interconnect various elements 1274, 1260, 1262, 1264, and 1266. Buses 1250 and 1255 may be interconnected together via a bus bridge 1272 such as at least one faceted IC die with facet breakouts embodiment. In an embodiment, the chipset 1220, via interface 1224, couples with a non-volatile memory 1260, a mass storage device(s) 1262, a keyboard/mouse 1264, a network interface 1266, smart TV 1276, and the consumer electronics 1277, etc.

In an embodiment, the mass storage device 1262 includes, but is not limited to, a solid state drive, a hard disk drive, a universal serial bus flash memory drive, or any other form of computer data storage medium. In one embodiment, the network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the faceted IC die with facet breakouts embodiment in a computing system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) can be incorporated into the processor core 1212.

Where useful, the computing system 1200 may have a broadcasting structure interface such as for affixing the faceted IC die with facet breakouts to a cellular tower.

To illustrate the faceted. IC die with facet breakouts embodiments and methods disclosed herein, a non-limiting list of examples is provided herein:

Example 1 is a semiconductor package apparatus, comprising: a package substrate including a die side and a land side; a faceted integrated circuit (IC) die with a concave facet that forms a die main section and a die ledge section, wherein the faceted IC die is on the package substrate; and a device coupled to the faceted IC die with breakout interconnects that emanate from the concave facet.

In Example 2, the subject matter of Example 1 optionally includes wherein the device coupled to the faceted integrated circuit die is a rectangular IC die.

In Example 3, the subject matter of Example 2 optionally includes wherein the faceted integrated circuit die is a first faceted IC die, further including a second faceted IC die on the package substrate, wherein the second faceted IC die includes a concave facet, wherein the first and second faceted IC dice are nested near the respective concave facets, and wherein the breakout interconnects couple the first and second faceted IC dice at respective concave facets.

In Example 4, the subject matter of any one or more of Examples 1-3 optionally include wherein the concave facet is a first concave facet, further including a second concave facet, and wherein the device coupled to the faceted integrated circuit die is a rectangular IC die that is nested to the first and second concave facets.

In Example 5, the subject matter of Example 4 optionally includes wherein the faceted integrated circuit die is a first faceted IC die, further including a second faceted IC die on the die side, wherein the second faceted IC die includes a concave facet; and wherein the device coupled to the first faceted integrated circuit die is also nested to the second faceted IC die.

In Example 6, the subject matter of any one or more of Examples 1-5 optionally include wherein the faceted IC die is flip-chip coupled to the die side with active devices and metallization bonded to the die side through an electrical bump, further including: an integral passive section in the faceted IC die that includes the concave facet; a first active section and a second active section that are set apart by the integral passive section, wherein the first active section is a logic processor and the second active section is a memory.

In Example 7, the subject matter of any one or more of Examples 1-6 optionally include wherein the faceted IC die is flip-chip coupled to the die side with active devices and metallization bonded to the die side through an electrical bump, further including: an integral passive section in the faceted IC die that that includes the concave facet; a first active section and a second active section that are set apart by the integral passive section, wherein the first active section is a logic processor and the second active section is a graphic processor.

In Example 8, the subject matter of any one or more of Examples 1-7 optionally include wherein the concave facet is a first concave facet, further including: a second concave facet; a third concave facet; and a fourth concave facet, wherein the faceted IC die has a frame form factor, and wherein the device coupled to the faceted integrated circuit die is a rectangular IC die that is nested to the first concave facet.

In Example 9, the subject matter of Example 8 optionally includes wherein the device coupled to the faceted IC die is a first IC die, further including a second IC die on the die side and nested to the second concave facet.

In Example 10, the subject matter of any one or more of Examples 8-9 optionally include wherein the device coupled to the faceted IC die is a first IC die, further including: a second IC die on the die side and nested to the second concave facet; a third IC die on the die side and nested to the third concave facet; and a fourth IC die on the die side and nested to the fourth concave facet.

In Example 11, the subject matter of any one or more of Examples 1-10 optionally include wherein the concave facet is a first concave facet, further including: a second concave facet; a third concave facet; and a fourth concave facet, wherein the faceted IC die has a cross form factor, and wherein the device coupled to the faceted integrated circuit die is a rectangular IC die that is nested to the first concave facet.

In Example 12, the subject matter of Example 11 optionally includes wherein the device coupled to the faceted IC die is a first IC die, further including a second IC die on the die side and nested to the second concave facet.

In Example 13, the subject matter of any one or more of Examples 11-12 optionally include wherein the device coupled to the faceted IC die is a first IC die, further including: a second IC die on the die side and nested to the second concave facet; a third IC die on the die side and nested to the third concave facet; and a fourth IC die on the die side and nested to the fourth concave facet.

Example 14 is a semiconductor package apparatus, comprising: a package substrate including a die side and a land side; a faceted silicon interposer on the die side, with a concave facet, wherein the faceted silicon interposer includes metallization and a through-interposer via (TIV) that couples the die side to the metallization; and a device coupled to the faceted silicon interposer with active devices and metallization that is face-to-face coupled to the faceted silicon interposer metallization.

In Example 15, the subject matter of Example 14 optionally includes wherein the device is a first integrated-circuit (IC) die, further including: a second IC die on faceted silicon interposer near one end, a third IC die near the other end of the first faceted silicon interposer, and wherein the first IC die is near the concave facet and between the second and third IC dice.

In Example 16, the subject matter of any one or more of Examples 14-15 optionally include wherein the faceted silicon interposer is a first faceted silicon interposer, further including: a second faceted silicon interposer on the die side, wherein the second faceted silicon interposer includes metallization and a through-interposer via (TIV) that couples the die side to the metallization; and a device coupled to the second faceted silicon interposer with active devices and metallization that is face-to-face coupled to the second faceted silicon interposer metallization.

In Example 17, the subject matter of Example 16 optionally includes wherein the device is a first integrated-circuit (IC) die, further including: a second IC die on second faceted silicon interposer near one end, a third IC die near the other end of the second faceted silicon interposer, and wherein the first IC die is near the concave facet and between the second and third IC dice.

In Example 18, the subject matter of any one or more of Examples 14-17 optionally include wherein the faceted silicon interposer is a first faceted silicon interposer, further including: a second faceted silicon interposer on the die side, wherein the second faceted silicon interposer includes metallization and a through-interposer via (TIV) that couples the die side to the metallization; a device coupled to the second faceted silicon interposer with active devices and metallization that is face-to-face coupled to the second faceted silicon interposer metallization; and an active bridge IC die that spans between the first faceted silicon interposer and the second faceted silicon interposer, and wherein the active bridge IC die is face-to-face coupled with active devices and metallization to respective metallizations of the first and second faceted silicon interposers.

In Example 19, the subject matter of any one or more of Examples 14-18 optionally include wherein the faceted silicon interposer is a first faceted silicon interposer, further including: a second faceted silicon interposer on the die side, wherein the second faceted silicon interposer includes metallization and a through-interposer via (TIV) that couples the die side to the metallization; a device coupled to the second faceted silicon interposer with active devices and metallization that is face-to-face coupled to the second faceted silicon interposer metallization; an active bridge IC die that spans between the first faceted silicon interposer and the second faceted silicon interposer, and wherein the active bridge IC die is face-to-face coupled with active devices and metallization to respective metallizations of the first and second faceted silicon interposers; and an IC die on the die side between the respective first and second faceted silicon interposers, and wherein the IC die on the die side is face-to-face coupled to the active bridge IC die with active devices and metallization.

In Example 20, the subject matter of any one or more of Examples 14-19 optionally include wherein the concave facet is a first concave facet, further including: a second concave facet; an IC die on the die side; and an active bridge IC die that spans between the faceted silicon interposer and the IC die on the die side, wherein the active bridge IC die is coupled face-to-face with the faceted silicon interposer and the IC die on the die side.

Example 21 is a computing system, comprising: a package substrate including a die side and a land side; a first faceted integrated circuit die with a concave facet that forms a die main section and a die ledge section, wherein the first faceted IC die is on the package substrate; a second faceted IC die on the package substrate, wherein the second faceted IC die includes a concave facet, wherein the first and second faceted IC dice are nested near the respective concave facets, and wherein the breakout interconnects couple the first and second faceted IC dice at respective concave facets; and a board coupled to the land side.

In Example 22, the subject matter of Example 21 optionally includes wherein the board further includes an external shell.

In Example 23, the subject matter of any one or more of Examples 21-22 optionally include wherein the first faceted IC die is selected from the group consisting of a logic processor, a graphics processor, a memory die, a memory-controller hub and a platform-controller hub.

Example 24 is a process of assembling a semiconductor package apparatus, comprising: assembling a faceted integrated-circuit die on a package substrate; and coupling the faceted IC die to a device through breakout interconnects from the faceted IC die.

In Example 25, the subject matter of Example 24 optionally includes stacking an IC device on the faceted IC die.

In Example 26, the subject matter of any one or more of Examples 24-25 optionally include assembling the faceted IC die to a computing system.

In Example 27, the subject matter of any one or more of Examples 24-26 optionally include wherein the faceted IC die is a first faceted IC die, further including: assembling the first faceted IC die to a computing system, wherein the first faceted IC die is selected from the group consisting of a logic processor, a graphics processor, a memory die, a memory-controller hub and a platform-controller hub; and assembling a second faceted IC die on the package substrate at a concave facet breakout region of the first faceted IC die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package apparatus, comprising:
  a package substrate including a die side and a land side;
  a faceted silicon interposer on the die side, with a concave facet, wherein the faceted silicon interposer includes metallization and a through-interposer via (TIV) that couples the die side to the metallization; and
  a device coupled to the faceted silicon interposer with active devices and metallization that is face-to-face coupled to the faceted silicon interposer metallization.

2. The semiconductor package apparatus of claim 1, wherein the device is a first integrated-circuit (IC) die, further including:
  a second IC die on faceted silicon interposer near one end, a third IC die near the other end of the first faceted silicon interposer, and wherein the first IC die is near the concave facet and between the second and third IC dice.

3. The semiconductor package apparatus of claim 1, wherein the faceted silicon interposer is a first faceted silicon interposer, further including:
  a second faceted silicon interposer on the die side, wherein the second faceted silicon interposer includes metallization and a through-interposer via (TIV) that couples the die side to the metallization; and a device coupled to the second faceted silicon interposer with active devices and metallization that is face-to-face coupled to the second faceted silicon interposer metallization.

4. The semiconductor package apparatus of claim 3, wherein the device is a first integrated-circuit (IC) die, further including:
  a second IC die on second faceted silicon interposer near one end, a third IC die near the other end of the second faceted silicon interposer, and wherein the first IC die is near the concave facet and between the second and third IC dice.

5. The semiconductor package apparatus of claim 1, wherein the faceted silicon interposer is a first faceted silicon interposer, further including:
  a second faceted silicon interposer on the die side, wherein the second faceted silicon interposer includes metallization and a through-interposer via (TIV) that couples the die side to the metallization;
  a device coupled to the second faceted silicon interposer with active devices and metallization that is face-to-face coupled to the second faceted silicon interposer metallization; and
  an active bridge IC die that spans between the first faceted silicon interposer and the second faceted silicon interposer, and wherein the active bridge IC die is face-to-face coupled with active devices and metallization to respective metallizations of the first and second faceted silicon interposers.

6. The semiconductor package apparatus of claim 1, wherein the faceted silicon interposer is a first faceted silicon interposer, further including:
  a second faceted silicon interposer on the die side, wherein the second faceted silicon interposer includes metallization and a through-interposer via (TIV) that couples the die side to the metallization:
  a device coupled to the second faceted silicon interposer with active devices and metallization that is face-to-face coupled to the second faceted silicon interposer metallization;
  an active bridge IC die that spans between the first faceted silicon interposer and the second faceted silicon interposer, and wherein the active bridge IC die is face-to-face coupled with active devices and metallization to respective metallizations of the first and second faceted silicon interposers; and
  an IC die on the die side between the respective first and second faceted silicon interposers, and wherein the IC die on the die side is face-to-face coupled to the active bridge IC die with active devices and metallization.

7. The semiconductor package apparatus of claim 1, wherein the concave facet is a first concave facet, further including:
  a second concave facet;
  an IC die on the die side; and
  an active bridge IC die that spans between the faceted silicon interposer and the IC die on the die side, wherein the active bridge IC die is coupled face-to-face with the faceted silicon interposer and the IC die on the die side.

\* \* \* \* \*